(12) United States Patent
Suter et al.

(10) Patent No.: US 9,666,460 B2
(45) Date of Patent: May 30, 2017

(54) THROUGH TYPE FURNACE FOR SUBSTRATES COMPRISING A LONGITUDINAL SLIT

(71) Applicant: Besi Switzerland AG, Cham (CH)

(72) Inventors: Guido Suter, Geuensee (CH); Kevin Domancich, Knonau (CH); Daniel Andreas Scherer, Birmensdorf (CH); Reto Weibel, Hunenberg (CH)

(73) Assignee: Besi Switzerland AG, Cham (CH)

( * ) Notice: Subject to any disclaimer, the term of this patent is extended or adjusted under 35 U.S.C. 154(b) by 349 days.

(21) Appl. No.: 14/549,327

(22) Filed: Nov. 20, 2014

(65) Prior Publication Data

US 2015/0136836 A1 May 21, 2015

(30) Foreign Application Priority Data

Nov. 20, 2013 (CH) ........................................ 1938/13

(51) Int. Cl.
| | |
|---|---|
| *B23K 3/08* | (2006.01) |
| *H01L 21/67* | (2006.01) |
| *B23K 3/04* | (2006.01) |
| *B23K 1/00* | (2006.01) |
| *B23K 1/008* | (2006.01) |

(Continued)

(52) U.S. Cl.
CPC ........ *H01L 21/67144* (2013.01); *B23K 1/008* (2013.01); *B23K 1/0016* (2013.01); *B23K 3/04* (2013.01); *B23K 3/087* (2013.01); *H01L 21/6776* (2013.01); *H01L 21/67098* (2013.01); *H01L 21/67109* (2013.01); *B23K 2201/42* (2013.01)

(58) Field of Classification Search
CPC ..... B23K 1/008; B23K 3/04; H01L 21/67098; H01L 21/67109; H01L 21/6776
USPC .................................. 432/121, 129, 239, 123
See application file for complete search history.

(56) References Cited

U.S. PATENT DOCUMENTS 1,926,354 A * 9/1933 Spatta ...................... B21J 17/00
432/10
2,227,295 A * 12/1940 Cope ...................... B23K 1/008
219/85.17

(Continued)

FOREIGN PATENT DOCUMENTS

DE 10 2011 053 340 A1 3/2013
EP 0 634 783 A1 1/1995

*Primary Examiner* — Erin Saad
*Assistant Examiner* — Carlos Gamino
(74) *Attorney, Agent, or Firm* — Nixon Peabody LLP

(57) ABSTRACT

A through-type furnace for substrates comprises a furnace with a channel and a transport system for the transport of the substrates through the channel. The channel is bounded by a base, a front side wall, a rear side wall and a top part. The base contains a plurality of first holes which are connectable to a protective gas source so that protective gas can be supplied during operation. The front side wall of the channel comprises a longitudinal slit which extends parallel to the passage direction and which is bounded by a bottom edge and an upper edge. The transport system comprises at least one clamp for transporting the substrates through the channel. The clamp is movable back and forth along the longitudinal slit of the channel. Such a through-type furnace is in particular suitable for use in a soft solder die bonder.

20 Claims, 2 Drawing Sheets

(51) Int. Cl.
*H01L 21/677* (2006.01)
*B23K 101/42* (2006.01)

(56) References Cited

U.S. PATENT DOCUMENTS

| | | | | |
|---|---|---|---|---|
| 2,366,088 | A * | 12/1944 | Coody | C21D 9/08 432/10 |
| RE29,590 | E * | 3/1978 | Whelan | F26B 15/128 219/388 |
| 4,543,059 | A | 9/1985 | Whang et al. | |
| 4,744,712 | A * | 5/1988 | Mitchell | H01L 21/67712 108/145 |
| 4,752,219 | A * | 6/1988 | Fisher, Jr. | C30B 35/005 414/940 |
| 4,752,268 | A * | 6/1988 | Kataoka | C03B 25/06 219/400 |
| 5,154,338 | A * | 10/1992 | Okuno | B23K 1/008 219/388 |
| 5,202,716 | A * | 4/1993 | Tateyama | B29C 31/00 396/612 |
| 5,264,002 | A | 11/1993 | Egashira et al. | |
| 5,354,198 | A * | 10/1994 | Yates | H01L 21/67754 432/11 |
| 5,839,870 | A * | 11/1998 | Niemirowski | F27D 5/0068 414/150 |
| 5,997,588 | A * | 12/1999 | Goodwin | F16K 51/02 29/25.01 |
| 6,336,775 | B1 * | 1/2002 | Morita | B65G 49/065 198/721 |
| 6,527,547 | B2 * | 3/2003 | De Bruin | H01J 9/263 432/133 |
| 2001/0026748 | A1 * | 10/2001 | Blonigan | H01L 21/67709 414/217 |
| 2003/0190574 | A1 * | 10/2003 | Schmid | H01L 21/6776 432/121 |
| 2003/0221853 | A1 * | 12/2003 | Shiozawa | B23K 1/008 174/50 |
| 2013/0008599 | A1 | 1/2013 | Graf et al. | |

* cited by examiner

THROUGH TYPE FURNACE FOR SUBSTRATES COMPRISING A LONGITUDINAL SLIT

PRIORITY CLAIM

Applicant hereby claims foreign priority under 35 U.S.C. §119 from Swiss Application No. 01938/13 filed Nov. 20, 2013, the disclosure of which is herein incorporated by reference.

FIELD OF THE INVENTION

The invention relates to a through-type furnace for substrates. The through-type furnace comprises at least one process station with a working opening where components, which are generally known in the field as "dies", are applied to the substrates. The invention further relates to a mounting apparatus with such a through-type furnace which is known as a die bonder. Examples for "dies" are especially semiconductor chips, but also capacitors, metal platelets etc.

BACKGROUND OF THE INVENTION

It is common practice in the mounting of semiconductor chips to connect the semiconductor chips, mainly power semiconductors, to the substrate by means of solder in order to ensure via the solder connection an effective dissipation of the heat loss from the semiconductor chip that occurs during operation. However, also other "dies" are soldered onto the substrate.

Metallic substrates, so-called leadframes, are mainly used as substrates, where the semiconductor chips are soldered onto chip islands arranged one after the other and optionally next to one another. Single-place substrates, which are also known as so-called singulated substrates, are also used. Such a single-place substrate consists of a ceramic platelet for example, which is covered on both sides by a metal layer. The substrates are usually supplied in cycles to a soldering station where the solder is applied, a distributing station where the solder is distributed on the substrate location, and then to a bonding station where the semiconductor chips are placed by means of a pick-and-place system on the liquid solder portions. The leadframes comprise holes arranged along their longitudinal edges, into which pins or fingers engage for the transport of the leadframes. A die bonder which is suitable for this process is marketed by the applicant under the name DB2009 SSI. This die bonder comprises a through-type furnace which is formed as a channel or tunnel, through which the substrates are transported to the soldering station, distributing station and bonding station. The forward feed of the substrates occurs by means of fingers which are provided with teeth, can be lifted and lowered, and moved back and forth, wherein each finger moves a substrate in the forward direction.

SUMMARY OF THE INVENTION

The invention is based on the object of developing a through-type furnace with a more flexible transport system.

According to the invention, the through-type furnace for substrates comprises a furnace with a channel and a transport system for the transport of the substrates through the channel, wherein the channel is bounded by a base, a front side wall, a rear side wall and a top part, the base contains a plurality of first holes which are connectable to a protective gas source in order to supply protective gas during operation, the front side wall of the channel comprises a longitudinal slit which extends parallel to the passage direction and is bounded by a bottom edge and an upper edge, the transport system comprises at least one clamp for transporting the substrates through the channel, and the clamp is movable back and forth along the longitudinal slit of the channel.

Preferably, a plurality of second holes which are connectable to the protective gas source are arranged on a side of the bottom edge of the longitudinal slit facing the channel.

Preferably, the bottom edge of the longitudinal slit is formed by a narrow strip which is lowered by a predetermined distance in relation to the base of the channel.

A groove may be formed in the narrow strip of the bottom edge of the longitudinal slit, and the second holes may open into the groove.

The channel may be subdivided into at least two zones and the groove may be interrupted by a separating wall at least at one transition point from one to the next zone.

The channel may be subdivided into at least two zones, each zone may be associated with a number of the second holes, and the second holes of the same zone may be connected to each other and may be connectable to the protective gas source via a separate flow control valve.

According to the invention, a Die Bonder with a through-type furnace comprising a heating zone and a cooling zone which are subdivided into several zones is programmed for the input of parameters, which determine for each zone a temperature, and a transport speed and/or a dwell time, and for the transport of the substrates through the through-type furnace according to these parameters.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not drawn to scale. In the drawings.

DETAILED DESCRIPTION OF THE INVENTION

Figure 1:
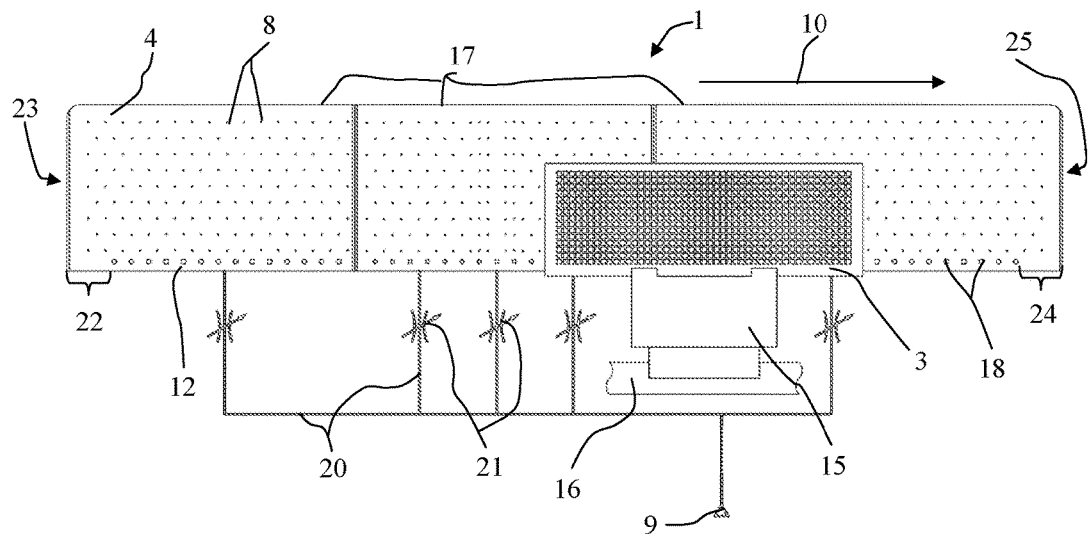
FIGS. 1, 2 show a top view of parts of a through-type furnace for substrates according to a first embodiment and a second embodiment.
Figure 2:
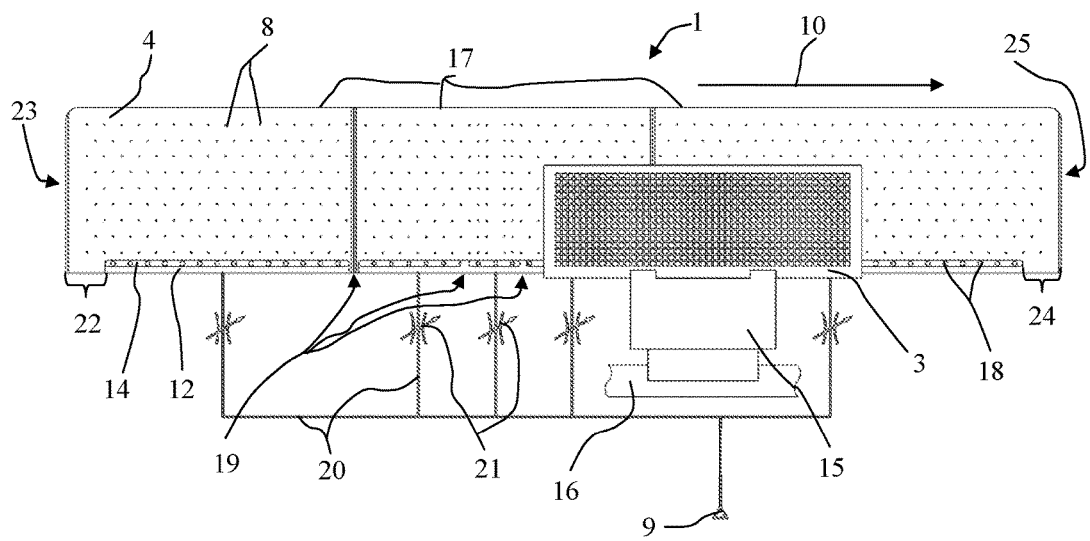
Figure 3:
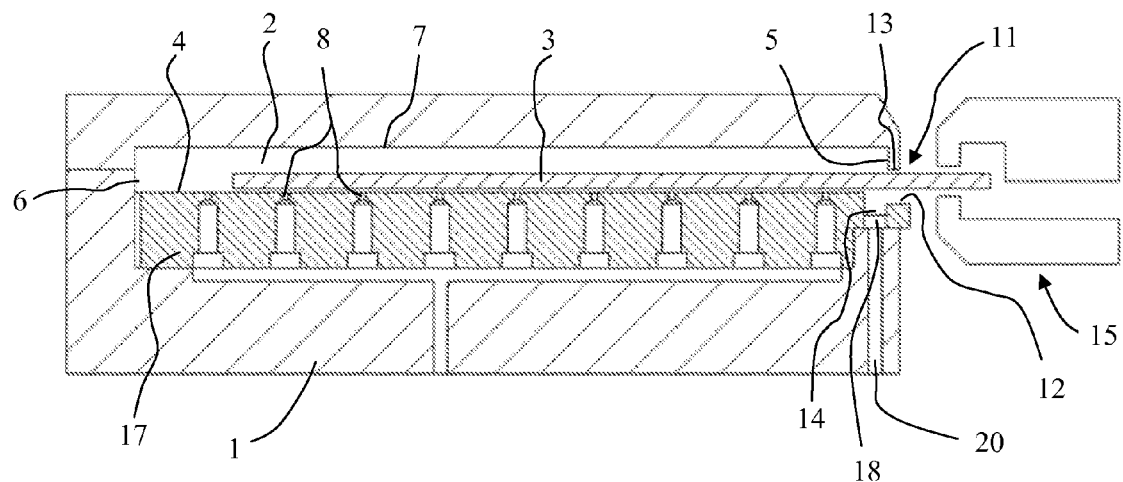
FIG. 3 shows a cross-sectional view of the through-type furnace.
Figure 4:
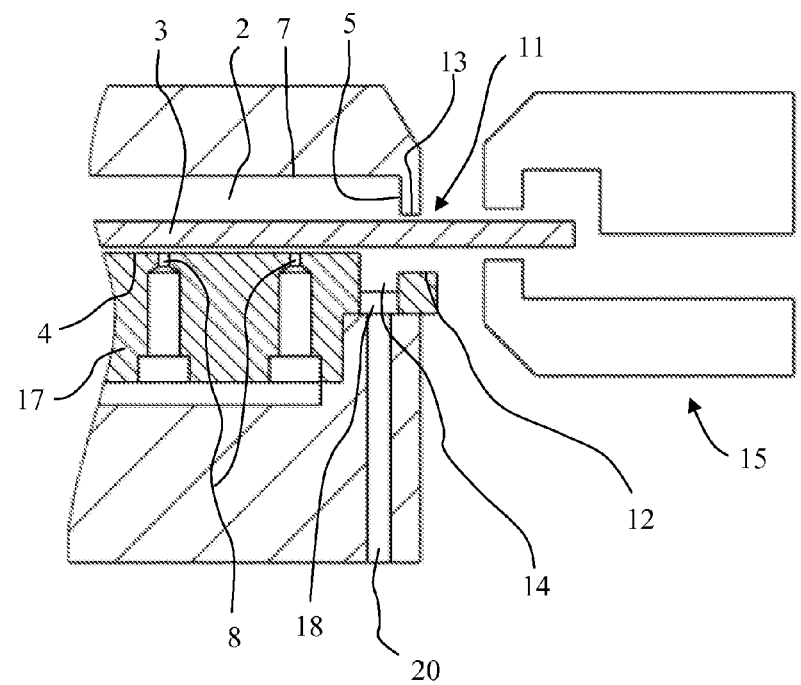
FIG. 4 shows an enlarged sectional view of FIG. 3.

FIGS. 1 and 2 show a top view of the parts of a through-type furnace for substrates which are necessary for understanding the invention according to a first embodiment and a second embodiment, respectively. The substrates are for example leadframes with a plurality of chip islands or single-place substrates. FIG. 3 shows a cross-sectional view of the through-type furnace of the embodiment according to FIG. 2, which extends transversely to the passage direction. FIG. 4 shows an enlarged sectional view of FIG. 3. The through-type furnace comprises a furnace 1 with a channel 2 and a transport system for the transport of the substrates 3 through the channel 2 to a process station or to several successively arranged process stations. Such process stations are for example a soldering station where the solder is applied to the substrate, a distributing station where the solder is distributed on the substrate location, and a bonding station where the semiconductor chips are applied to the substrate. The soldering station and the distributing station can be omitted when the rear side of the semiconductor chips or the substrate has already been coated with respective substances which then lead to the soldered connection. The channel 2 is bounded by a base 4, a front side wall 5, a rear side wall 6 and a top part 7. The top part 7 is provided with a respective working opening at the process station(s). The base 4 is provided with a plurality of first holes 8, via which a protective gas supplied by a protective gas source 9 can be delivered during operation. Frequently used protective gases are nitrogen, forming gas or other reactive gases. It is important that the protective gas does not contain any oxygen. The density of the first holes 8 in the base 4 usually differs in different zones of the channel 2. The density of the first holes 8 and/or their diameter can be greater especially in the region of the process stations, because a part of the protective gas escapes via the respective working opening. The front side wall 5 of the channel 2 comprises a longitudinal slit 11 extending parallel to the passage direction 10. The longitudinal slit 11 is bounded by a bottom edge 12 and an upper edge 13, wherein the bottom edge 12 is flush with the base 4 or—as shown in FIG. 3—is lowered in relation to the base 4. The transport system comprises at least one clamp 15 with two clamping jaws for transporting the substrates 3 through the channel 2. The clamp(s) 15 is/are mounted on a guide rail 16 (only shown in part) extending parallel to the longitudinal slit 11 of the channel 2 and can be moved back and forth. The at least one clamp 15 transports one substrate 3 after the other to the process station or stations of the furnace 1. FIGS. 1 and 2 show only one substrate 3 and only one clamp 15 for reasons of clarity of the illustration.

The base 4 is preferably formed by so-called inserts 17, which are formed with channels and depressions on the side opposite of the base 4 of the channel 2, which channels and depressions guide the protective gas to the first holes 8. Electrical heatings are arranged in the base 4 in order to heat the furnace 1.

A plurality of second holes 18 are advantageously arranged on the side of the bottom edge 12 facing the channel 2, wherein protective gas can also be supplied to the second holes 18 in order to thus form a gas shower. The protective gas ejected from the second holes 18 flows against the bottom side of the substrates 3 and thereafter into the ambient environment, thus forming a gas curtain which prevents the penetration of oxygen of the ambient air into the channel 2.

The protective gas swirls around the part of the substrate 3 protruding at the longitudinal slit 11 out of the channel 2 and flows upwardly along the exterior side of the furnace. The protective gas also escapes from the furnace between the upper edge 13 of the longitudinal slit 11 of the furnace and the substrate 3 and forms a second gas curtain together with the protective gas rising from below. The two gas curtains prevent the penetration of oxygen of the ambient air to the hot substrate 3 in the interior of the channel 2 and thus prevent an oxidation of the surface of the substrate 3. Oxidation of the substrate 3 occurs at most on the part of the substrate 3 protruding from the channel 2.

The gas curtains also prevent the occurrence of the Bernoulli effect: without the gas curtains, protective gas flowing in the interior of the channel 2 to the inlet opening 23 or the outlet opening 25 or to a process opening in the top part 7 would produce a negative pressure in the longitudinal slit 11 due to the Bernoulli effect and would thus draw in ambient air.

In order to prevent swirling of the protective gas blown out from the longitudinal slit 11 with the ambient air and to thus prevent the permeation of oxygen of the ambient air, the protective gas blown out from the second holes 18 should reach the ambient environment as a constant laminar flow. In order to support the achievement of this goal in an optimal fashion, advantageously the following measure a) or both measures a) and b) are additionally implemented:

a) The bottom edge 12 of the longitudinal slit 11 is formed by a narrow strip which is lowered in relation to the base 4 of the channel 2 by a predetermined distance.

b) A groove 14 is formed in the narrow strip of the bottom edge 12 and the second holes 18 open into the base 4 and/or a side wall of the groove 14. This embodiment is shown in FIGS. 2 to 4.

The channel 2 of the through-type furnace is typically subdivided into at least two zones, namely at least one preheating zone for the controlled heating of the substrates 3, at least one process zone and optionally at least one cooling zone for the controlled cooling of the substrates 3. A separate heating is associated with each zone, so that the temperature is freely programmable in each zone.

A number of first holes 8 and a number of second holes 18 is associated with each zone. This means that the first holes 8 of each zone are connected to each other and the second holes 18 of each zone are connected to each other. The supply of the protective gas to the mutually connected first holes 8 of a zone and the mutually connected second holes 18 of a zone preferably occurs via different gas lines 20 and individually adjustable flow control valves 21, so that the supply with protective gas can be set separately for each zone and optimally as required both in the channel 2 and also in the gas curtain limiting the channel 2.

The groove 14 can be interrupted by a separating wall 19 at least at individual transition points from one zone to the next, because the demand for protective gas or its flow properties can differ in the various zones. The separating walls 19 also provide support in the respect that the protective gas flows in the individual zones to the highest possible extent with a constant laminar flow through the longitudinal slit 11 to the ambient environment.

The second holes 18, the groove 14 and/or the lowering of the bottom edge 12 can extend over the entire length of the longitudinal slit 11 or may be omitted—as shown in FIGS. 1 and 2—over a short section 22 after the inlet opening 23 of the channel 2 and a short section 24 before the outlet opening 25 of the channel 2.

During the transport, the substrates 3 protrude out of the channel 2 to a small extent so that they can be gripped by the clamp 15 and transported. The clamp 15 does not protrude into the longitudinal slit 11. The transport apparatus is preferably set up to slightly lift the substrates 3 during forward transport, so that they do not slide on the base 4 of the channel 2. The distance between the upper edge 13 of the longitudinal slit 11 and the base 4 of the channel 2 is accordingly dimensioned to a sufficiently large extent.

The invention allows building a through-type furnace in which the heating zone and/or cooling zone is subdivided into several zones in which a different temperature prevails, and the transport system with the freely programmable clamps allows transporting the substrates according to a predetermined temperature and time profile through the through-type furnace. An automatic mounting machine in accordance with the invention for "dies", which are known in the field as die bonders or also as soft solder die bonders, which is set up for soldering dies, e.g. semiconductor chips, onto substrates, contains a through-type furnace in accordance with the invention and is preferably programmed for the input of parameters, which determine for each zone a temperature and a transport speed and/or a dwell time, and for the transport of the substrates through the through-type furnace according to these parameters. The input of the parameters occurs during setup, i.e. before the regular mounting operations.

The through-type furnace and also the die bonder can also be used for fitting substrates with components or dies other than the semiconductor chips mentioned in the embodiments explained above.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A through-type furnace for substrates, comprising:
a furnace with a channel and
a transport system for transporting substrates through the channel,
wherein the furnace comprises one or more heating zones and one or more cooling zones,
the channel is bounded by a base, a front side wall, a rear side wall and a top part,
the base contains a plurality of first holes which are connectable to a protective gas source in order to supply protective gas during operation,
the front side wall of the channel comprises a longitudinal slit which extends parallel to a passage direction and is bounded by a bottom edge and an upper edge, and extends through the one or more heating zones and the one or more cooling zones,
the transport system comprises at least one clamp for transporting the substrates through the channel and the longitudinal slit, and
the clamp is movable back and forth along the longitudinal slit of the channel and clamps the substrates outside the furnace.

2. The trough-type furnace of claim 1, wherein a plurality of second holes which are connectable to the protective gas source are arranged on a side of the bottom edge of the longitudinal slit facing the channel.

3. The trough-type furnace of claim 1, wherein the bottom edge of the longitudinal slit is formed by a narrow strip which is lowered by a predetermined distance in relation to the base of the channel.

4. The trough-type furnace of claim 3, wherein a groove is formed in the narrow strip of the bottom edge of the longitudinal slit, and second holes open into the groove.

5. The trough-type furnace of claim 4, wherein the groove is interrupted by a separating wall at least at one transition point from one to the next zone.

6. The trough-type furnace of claim 2, wherein the bottom edge of the longitudinal slit is formed by a narrow strip which is lowered by a predetermined distance in relation to the base of the channel.

7. The trough-type furnace of claim 6, wherein a groove is formed in the narrow strip of the bottom edge of the longitudinal slit, and the second holes open into the groove.

8. The trough-type furnace of claim 7, wherein the groove is interrupted by a separating wall at least at one transition point from one to the next zone.

9. The trough-type furnace of claim 1, wherein
at least one zone is associated with a number of the second holes, and
the second holes of the same zone are connected to each other and are connectable to the protective gas source via a separate flow control valve.

10. The trough-type furnace of claim 2, wherein
at least one zone is associated with a number of the second holes, and
the second holes of the same zone are connected to each other and are connectable to the protective gas source via a separate flow control valve.

11. The trough-type furnace of claim 4, wherein
at least one zone is associated with a number of the second holes, and
the second holes of the same zone are connected to each other and are connectable to the protective gas source via a separate flow control valve.

12. The trough-type furnace of claim 7, wherein
at least one zone is associated with a number of the second holes, and
the second holes of the same zone are connected to each other and are connectable to the protective gas source via a separate flow control valve.

13. A die bonder comprising:
a furnace with a channel and
a transport system for transporting substrates through the channel,
wherein the furnace comprises one or more heating zones and one or more cooling zones,
the channel is bounded by a base, a front side wall, a rear side wall and a top part,
the base contains a plurality of first holes which are connectable to a protective gas source in order to supply protective gas during operation,
the front side wall of the channel comprises a longitudinal slit which extends parallel to a passage direction, is bounded by a bottom edge and an upper edge, and extends through the one or more heating zones and the one or more cooling zones,
the transport system comprises at least one clamp for transporting the substrates through the channel and the longitudinal slit,
the clamp is movable back and forth along the longitudinal slit of the channel and clamps the substrates outside the furnace, and
the die bonder is programmed for inputting of parameters, which determine for each zone a temperature and at least one of a transport speed and a dwell time, and for transporting the substrates through the furnace according to these parameters.

14. The die bonder of claim 13, wherein a plurality of second holes which are connectable to the protective gas source are arranged on a side of the bottom edge of the longitudinal slit facing the channel of the furnace.

15. The die bonder of claim 13, wherein the bottom edge of the longitudinal slit is formed by a narrow strip which is lowered by a predetermined distance in relation to the base of the channel.

16. The die bonder of claim 15, wherein a groove is formed in the narrow strip of the bottom edge of the longitudinal slit, and second holes open into the groove.

17. The die bonder of claim 16, wherein the groove is interrupted by a separating wall at least at one transition point from one to the next zone.

18. The die bonder of claim 14, wherein the bottom edge of the longitudinal slit is formed by a narrow strip which is lowered by a predetermined distance in relation to the base of the channel.

19. The die bonder of claim 18, wherein a groove is formed in the narrow strip of the bottom edge of the longitudinal slit, and the second holes open into the groove.

20. The die bonder of claim 19, wherein the groove is interrupted by a separating wall at least at one transition point from one to the next zone.

* * * * *